(12) United States Patent
Ko et al.

(10) Patent No.: US 8,035,211 B2
(45) Date of Patent: Oct. 11, 2011

(54) INTEGRATED CIRCUIT PACKAGE SYSTEM WITH SUPPORT STRUCTURE UNDER WIRE-IN-FILM ADHESIVE

(75) Inventors: WonJun Ko, Sungnam-Si (KR); BoHan Yoon, Icheon-Si (KR); JoungUn Park, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 129 days.

(21) Appl. No.: 12/055,634

(22) Filed: Mar. 26, 2008

(65) Prior Publication Data
US 2009/0243070 A1 Oct. 1, 2009

(51) Int. Cl.
H01L 23/12 (2006.01)

(52) U.S. Cl. ........... 257/686; 257/690; 257/E23.003; 257/E21.511; 438/108

(58) Field of Classification Search ............ 257/686, 257/687, E21.511, E23.003; 438/109
See application file for complete search history.

(56) References Cited

U.S. PATENT DOCUMENTS

| | | | |
|---|---|---|---|
| 6,388,313 B1 | 5/2002 | Lee et al. | |
| 6,657,290 B2 | 12/2003 | Fukui et al. | |
| 7,084,514 B2 | 8/2006 | Corisis et al. | |
| 7,091,623 B2 * | 8/2006 | Tsai et al. | 257/783 |
| 7,332,372 B2 | 2/2008 | Derderian | |
| 7,354,800 B2 | 4/2008 | Carson | |
| 7,582,693 B2 | 9/2009 | Kannan et al. | |
| 2002/0096755 A1 * | 7/2002 | Fukui et al. | 257/686 |
| 2003/0038374 A1 * | 2/2003 | Shim et al. | 257/777 |
| 2004/0145039 A1 * | 7/2004 | Shim et al. | 257/678 |
| 2005/0269692 A1 * | 12/2005 | Kwon et al. | 257/723 |
| 2006/0267177 A1 * | 11/2006 | Morrison et al. | 257/691 |
| 2006/0267609 A1 | 11/2006 | Lee et al. | |
| 2007/0001296 A1 * | 1/2007 | Lee et al. | 257/723 |
| 2007/0181990 A1 | 8/2007 | Huang et al. | |
| 2007/0278696 A1 | 12/2007 | Lu et al. | |
| 2009/0243068 A1 | 10/2009 | Kuan et al. | |

* cited by examiner

Primary Examiner — Benjamin Sandvik
Assistant Examiner — Krista Soderholm
(74) Attorney, Agent, or Firm — Mikio Ishimaru

(57) ABSTRACT

An integrated circuit package in package system including: providing a substrate; mounting a wire bonded die with an active side over the substrate; connecting the active side to the substrate with bond wires; mounting a structure over the wire bonded die having a wire-in-film adhesive between the structure and the wire bonded die and overhangs at ends of the structure between the wire-in-film adhesive and the substrate; mounting support structures at the overhangs between the wire-in-film adhesive and the substrate; and encapsulating the wire bonded die and the structure with an encapsulation.

20 Claims, 3 Drawing Sheets

INTEGRATED CIRCUIT PACKAGE SYSTEM WITH SUPPORT STRUCTURE UNDER WIRE-IN-FILM ADHESIVE

CROSS-REFERENCE TO RELATED APPLICATION

The present application contains subject matter related to concurrently filed U.S. patent application Ser. No. 12/055,608. The related application is assigned to STATS ChipPAC Ltd.

TECHNICAL FIELD

The present invention relates generally to an integrated package system, and more particularly to a system for using a support structure under wire-in-film adhesive.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package in package system including: providing a substrate; mounting a wire bonded die with an active side over the substrate; connecting the active side to the substrate with bond wires; mounting a structure over the wire bonded die having a wire-in-film adhesive between the structure and the wire bonded die and overhangs at ends of the structure between the wire-in-film adhesive and the substrate; mounting support structures at the overhangs between the wire-in-film adhesive and the substrate; and encapsulating the wire bonded die and the structure with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
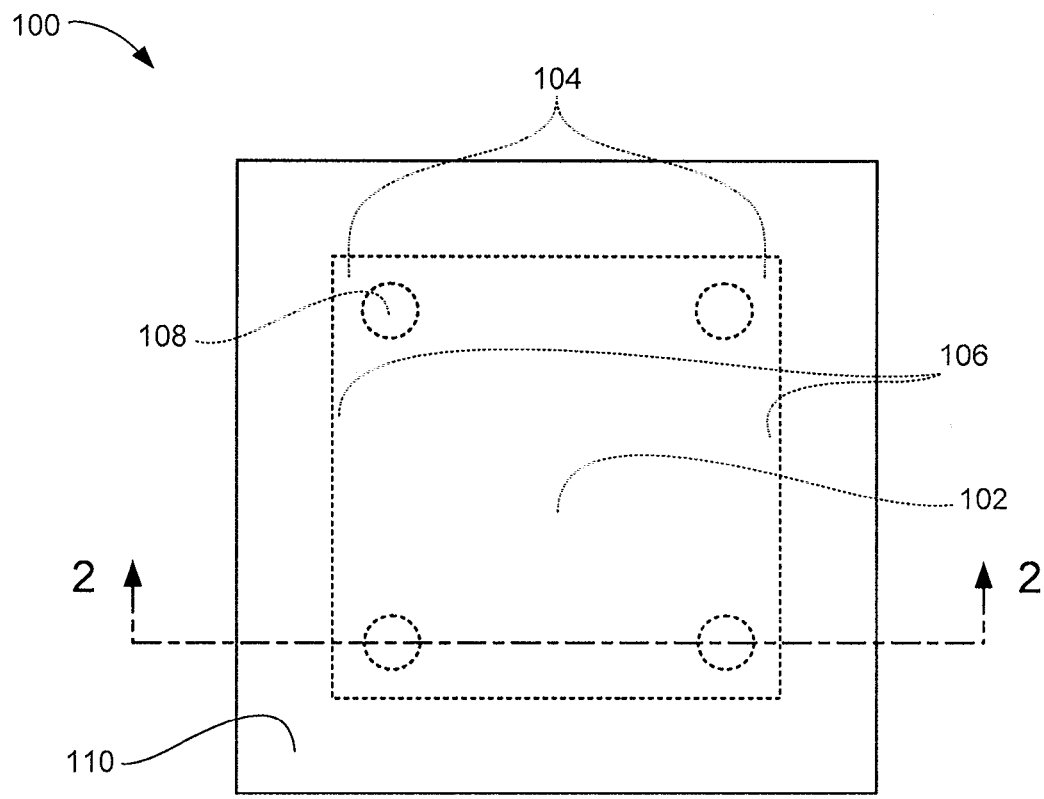
FIG. 1 is a top view of an integrated circuit package system, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a top view of an integrated circuit package system 100, in a first embodiment of the present invention. The integrated circuit package system 100 is shown having a structure, such as an upper wire bonded die 102, with corners 104 and edges 106.

The upper wire bonded die 102 is shown supported at the corners 104 by support structures 108, such as organic pillars or conductive metal pillars. The upper wire bonded die 102 and the support structures 108 are shown encapsulated by an encapsulation 110 such as an epoxy mold compound (EMC).

Figure 2:
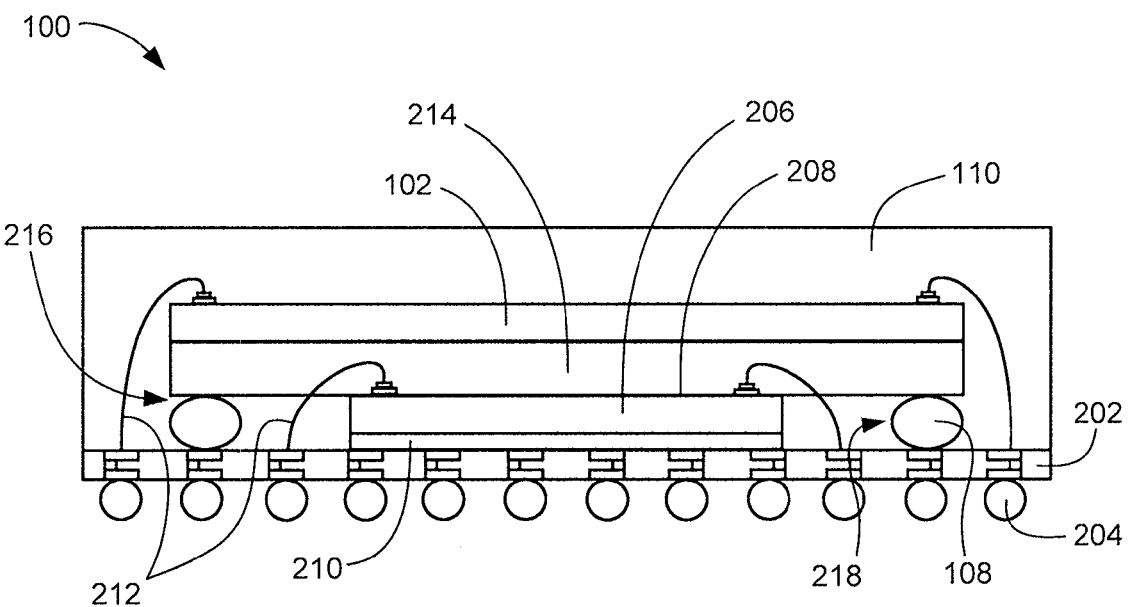
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 is shown having a substrate 202, such as a laminated plastic or ceramic substrate. Below the substrate are mounted external interconnects 204, such as solder balls.

Above the substrate 202 is mounted a wire bonded die 206 with an active side 208. The wire bonded die 206 is attached to the substrate 202 with a die attach adhesive 210. The active side 208 is connected to the substrate 202 with bond wires 212. The support structures 108 is mounted on the substrate 202. Mounted above the wire bonded die 206 and the support structures 108 is the upper wire bonded die 102. Between the upper wire bonded die 102 and the wire bonded die 206 is a wire-in-film adhesive 214. The wire-in-film adhesive 214 is in contact with the upper wire bonded die 102 and the wire bonded die 206.

The wire-in-film adhesive 214 has a low viscosity and, as temperature increases, the viscosity gets lower. Therefore, the wire-in-film adhesive 214 can be easily pressed over the bond wires 212 and above and around the wire bonded die 206 and then cured to harden the wire-in-film adhesive 214.

It has been discovered that the wire-in-film adhesive 214 should be a thermally conductive dielectric material. The wire-in-film adhesive 214 can be made of a B-stage material that can be hardened after curing and can maintain a predetermined thickness.

The upper wire bonded die 102 is connected to the substrate 202 with the bond wires 212. The upper wire bonded die 102 is larger than the wire bonded die 206 and so creates an overhang 216 beneath the upper wire bonded die 102 and the wire-in-film adhesive 214 and over the substrate 202. Between the overhang 216 and the substrate 202 is the support structure 106 in contact with both the wire-in-film adhesive 214 and the substrate 202.

It has been unexpectedly discovered that the support structure 106 can reduce wire bonding bouncing which happens during the wire bonding process connecting the upper wire bonded die 102 to the substrate 202. The wire bonding process flexes the upper wire bonded die 102 and can cause the failure of the upper wire bonded die 102.

Numerous other aspects have been discovered. One such aspect is that there is no limitation for the size of the overhang 216. Another aspect is that the total size of the integrated circuit package system 100 is reduced because the upper wire bonded die 102 is stable enough to use bond on trace wire bonding. Yet another aspect is that the upper wire bonded die 102 and the wire bonded die 206 may be reverse pyramid stacked, meaning the wire bonded die 206, which is smaller, may be mounted under the upper wire bonded die 102, which is larger.

The encapsulation 110 encapsulates the bond wires 212, the upper wire bonded die 102, the wire bonded die 206, the wire-in-film adhesive 214, and the support structures 108. The encapsulation 110 is further shown encapsulating a large surface area of the support structures 108 because the support structures 108 are shown to have substantially curved sides 218. The result is minimal contact to the support structures 108 between the substrate 202 and the wire-in-film adhesive 214, but maximum contact between the support structures and the encapsulation 110.

Figure 3:
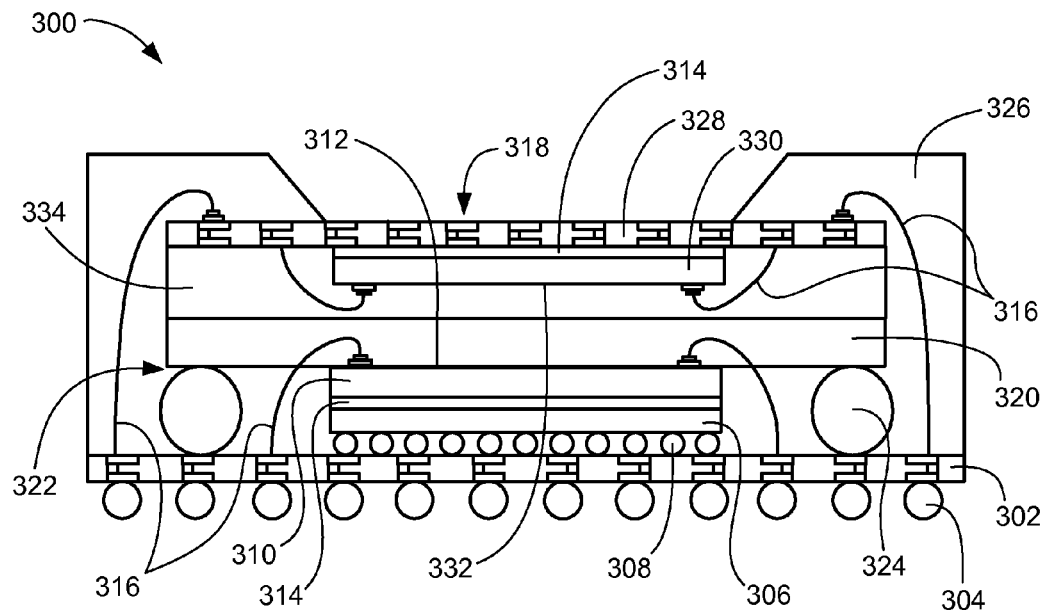
FIG. 3 is a cross sectional view of an integrated circuit package system in a second embodiment of the present invention.

Referring now to FIG. 3, therein is shown a cross sectional view of an integrated circuit package system 300 in a second embodiment of the present invention. The integrated circuit package system 300 is shown having a substrate 302, such as a laminated plastic or ceramic substrate.

Below the substrate are mounted external interconnects 304, such as solder balls. Above the substrate 302 is mounted a component such as a flip chip 306. Connecting the flip chip 306 to the substrate 302 are electrical interconnects such as solder balls 308. Above the flip chip 306 is mounted a wire bonded die 310 having an active side 312. The wire bonded die 310 is attached to the flip chip 306 by a die attach adhesive 314.

The active side 312 is connected to the substrate 302 with bond wires 316. Mounted above the wire bonded die 310 is a structure such as an inner stacking module 318. Between the inner stacking module 318 and the wire bonded die 310 is a wire-in-film adhesive 320. The wire-in-film adhesive 320 is in contact with the inner stacking module 318 and the wire bonded die 310.

The wire-in-film adhesive 320 has a low viscosity and, as temperature increases, the viscosity gets lower. Therefore, the wire-in-film adhesive 320 can be easily pressed over the bond wires 316 and above and around the wire bonded die 310 and then cured to harden the wire-in-film adhesive 320.

It has been discovered that the wire-in-film adhesive 320 should be a thermally conductive dielectric material. The wire-in-film adhesive 320 can be made of a B-stage material that can be hardened after curing and can maintain a predetermined thickness.

From above, the inner stacking module 318 is connected to the substrate 302 with the bond wires 316. The inner stacking module 318 is larger than the wire bonded die 310 and so creates an overhang 322 beneath the inner stacking module 318 and the wire-in-film adhesive 320.

Between the overhang 322 and the substrate 302 is a support structure 324, such as an organic pillar or a conductive metal pillar. An encapsulation 326 encapsulates the bond wires 316, the inner stacking module 318, the wire bonded die 310, the wire-in-film adhesive 320, and the support structures 324.

The inner stacking module 318 is shown having an inner stacking module substrate 328 such as a laminated plastic or ceramic substrate. Below the inner stacking module substrate 328 is mounted an inner stacking module wire bonded die 330 with an active side 332.

The inner stacking module wire bonded die 330 is attached to the inner stacking module substrate 328 with the die attach adhesive 314. The active side 332 is connected to the inner stacking module substrate 328 with the bond wires 316.

The inner stacking module wire bonded die 330 is encapsulated with an inner stacking module encapsulation 334, such as an EMC. Other devices may be mounted above the inner stacking module substrate 328.

Figure 4:
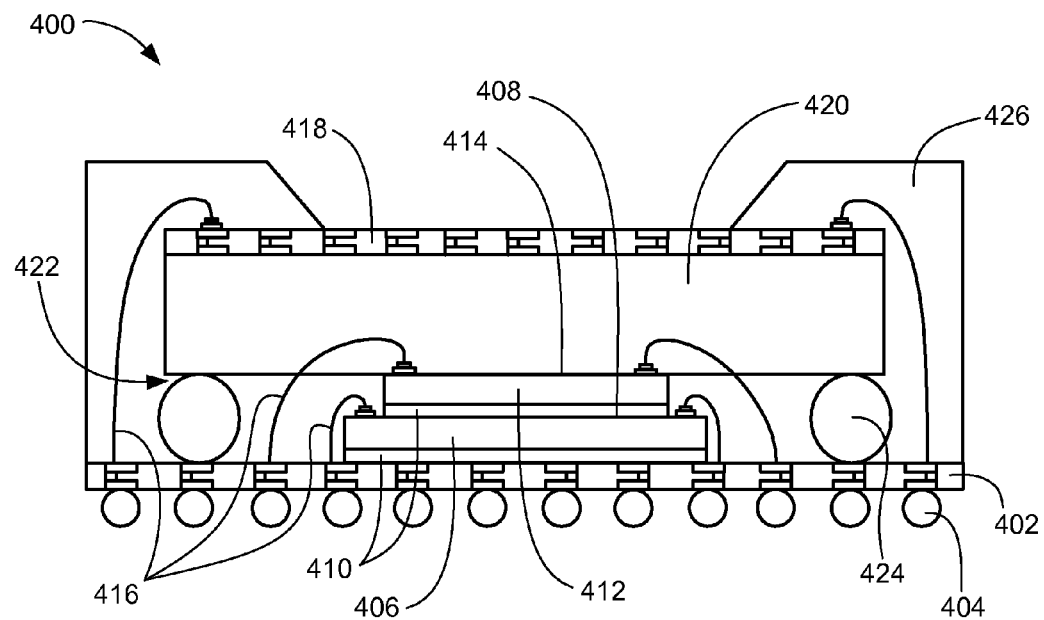
FIG. 4 is a cross sectional view of an integrated circuit package system in a third embodiment of the present invention.

Referring now to FIG. 4, therein is shown a cross sectional view of an integrated circuit package system 400 in a third embodiment of the present invention. The integrated circuit package system 400 is shown having a substrate 402, such as a laminated plastic or ceramic substrate.

Below the substrate are mounted external interconnects 404, such as solder balls. Above the substrate 402 is mounted a component such as a bottom wire bonded die 406 with an active side 408. The bottom wire bonded die 406 is attached to the substrate 402 with a die attach adhesive 410. Above the bottom wire bonded die 406 is mounted a wire bonded die 412 having an active side 414.

The wire bonded die 412 is attached to the bottom wire bonded die 406 by the die attach adhesive 410. The active side 414 of the wire bonded die 412 and the active side of the bottom wire bonded die 406 is connected to the substrate 402 with bond wires 416. Mounted above the wire bonded die 412 is a structure such as an interposer 418. Between the interposer 418 and the wire bonded die 412 is a wire-in-film adhesive 420. The wire-in-film adhesive 420 is in contact with the interposer 418 and the wire bonded die 412.

The wire-in-film adhesive 420 has a low viscosity and, as temperature increases, the viscosity gets lower. Therefore, the wire-in-film adhesive 420 can be easily pressed over the bond wires 416 and above and around the wire bonded die 412 and then cured to harden the wire-in-film adhesive 420.

It has been discovered that the wire-in-film adhesive 420 should be a thermally conductive dielectric material. The wire-in-film adhesive 420 can be made of a B-stage material that can be hardened after curing and can maintain a predetermined thickness.

From above, the interposer 418 is connected to the substrate 402 with the bond wires 416. The interposer 418 is larger than the wire bonded die 412 and so creates an overhang 422 beneath the interposer 418 and the wire-in-film adhesive 420.

Between the overhang 422 and the substrate 402 is a support structure 424, such as an organic pillar or a conductive metal pillar. An encapsulation 426 encapsulates the bond wires 416, the interposer 418, the wire bonded die 412, the wire-in-film adhesive 420, and the support structures 424.

Figure 5:
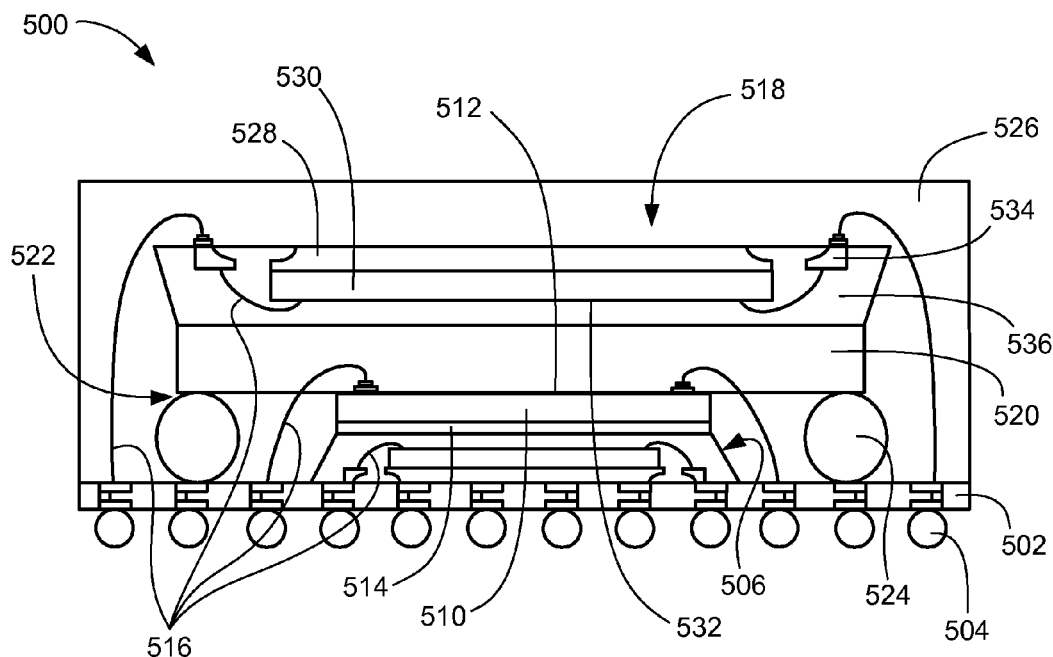
FIG. 5 is a cross sectional view of an integrated circuit package system in a fourth embodiment of the present invention.

Referring now to FIG. 5, therein is shown a cross sectional view of an integrated circuit package system 500 in a fourth embodiment of the present invention. The integrated circuit package system 500 is shown having a substrate 502, such as a laminated plastic or ceramic substrate.

Below the substrate are mounted external interconnects 504, such as solder balls. Above the substrate 502 is mounted a component such as a bottom pre-molded package 506. Above the bottom pre-molded package 506 is mounted a wire bonded die 510 having an active side 512.

The wire bonded die 510 is attached to the bottom pre-molded package 506 by a die attach adhesive 514. The active side 512 is connected to the substrate 502 with bond wires 516. Mounted above the wire bonded die 510 is a structure such as a pre-molded package 518. Between the pre-molded package 518 and the wire bonded die 510 is a wire-in-film adhesive 520. The wire-in-film adhesive 520 is in contact with the pre-molded package 506 and the wire bonded die 510.

The wire-in-film adhesive 520 has a low viscosity and, as temperature increases, the viscosity gets lower. Therefore, the wire-in-film adhesive 520 can be easily pressed over the bond wires 516 and above and around the wire bonded die 510 and then cured to harden the wire-in-film adhesive 520.

It has been discovered that the wire-in-film adhesive 520 should be a thermally conductive dielectric material. The wire-in-film adhesive 520 can be made of a B-stage material that can be hardened after curing and can maintain a predetermined thickness.

From above, the pre-molded package 518 is connected to the substrate 502 with the bond wires 516. The pre-molded package 518 is larger than the wire bonded die 510 and so creates an overhang 522 beneath the pre-molded package 518 and the wire-in-film adhesive 520.

Between the overhang 522 and the substrate 502 is a support structure 524, such as an organic pillar or a conductive metal pillar. An encapsulation 526 encapsulates the bond wires 516, the pre-molded package 518, the wire bonded die 510, the wire-in-film adhesive 520, and the support structures 524.

The pre-molded package 518 is shown having a die attach pad 528. Below the die attach pad 528 is mounted a pre-molded package wire bonded die 530 with an active side 532. The active side 532 is connected to bond fingers 534 with the bond wires 516. The pre-molded package wire bonded die 530 is encapsulated with a pre-molded package encapsulant 536, such as an EMC.

Figure 6:
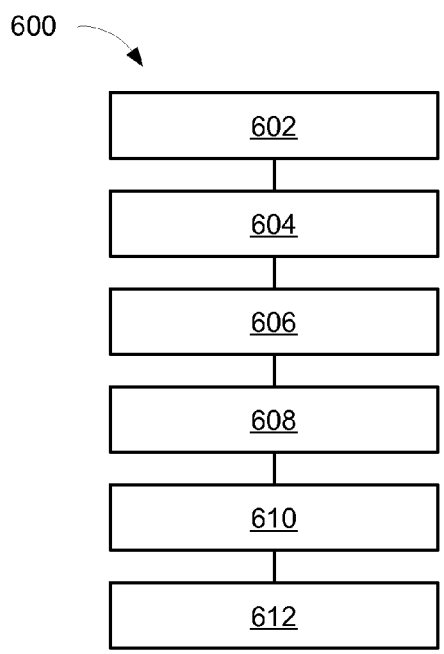
FIG. 6 is a flow chart of an integrated circuit package system for manufacture of an integrated circuit package system in an embodiment of the present invention.

Referring now to FIG. 6, therein is shown a flow chart of a system 600 for manufacturing the integrated circuit package system 100. The system 600 includes providing a substrate in a block 602; mounting a wire bonded die with an active side over the substrate in a block 604; connecting the active side to the substrate with bond in a block 606; mounting a structure over the wire bonded die having a wire-in-film adhesive between the structure and the wire bonded die and overhangs at ends of the structure between the wire-in-film adhesive and the substrate in a block 608; mounting support structures at the overhangs between the wire-in-film adhesive and the substrate in a block 610; and encapsulating the wire bonded die and the structure with an encapsulation in a block 612.

Thus, it has been discovered that the support structure under wire-in-film adhesive system of the present invention furnishes important and heretofore unknown and unavailable solutions, capabilities, and functional aspects for integrated circuit packages. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package in package system comprising:
   providing a substrate;
   mounting a wire bonded die with an active side over the substrate;
   connecting the active side to the substrate with bond wires;
   mounting support structures having substantially curved sides on the substrate;
   mounting a structure, having overhangs at ends of the structure over the substrate, over the wire bonded die having a wire-in-film adhesive of a thermally conductive dielectric material in contact with and between the structure and the wire bonded die with the support structures in contact with and between the wire-in-film adhesive and the substrate; and
   encapsulating the wire bonded die and the structure with an encapsulation.

2. The method as claimed in claim 1 wherein:
   mounting the structure includes mounting an inner stacking module.

3. The method as claimed in claim 1 wherein:
   mounting the structure includes mounting an upper wire bonded die.

4. The method as claimed in claim 1 wherein:
   mounting the structure includes mounting an interposer.

5. The method as claimed in claim 1 wherein:
   mounting the structure includes mounting a pre-molded package.

6. A method of manufacturing an integrated circuit package in package system comprising:
   providing a substrate with a component mounted thereover;
   mounting a wire bonded die with an active side over the component;
   connecting the active side to the substrate with bond wires;
   mounting support structures having substantially curved sides on the substrate;
   mounting a structure, having corners and overhangs at ends of the structure over the substrate, over the wire bonded die having a wire-in-film adhesive of a thermally conductive dielectric in contact with and between the structure and the wire bonded die with the support structures in contact with and between the wire-in-film adhesive and the substrate; and
   encapsulating the wire bonded die and the structure with an encapsulation.

7. The method as claimed in claim 6 wherein:
   mounting the component includes mounting a bottom pre-molded package.

8. The method as claimed in claim 6 wherein:
   mounting the component includes mounting a bottom wire bonded die.

9. The method as claimed in claim 6 wherein:
   mounting the component includes mounting a flip chip.

10. The method as claimed in claim 6 wherein:
    mounting the support structures includes mounting the support structures at the corners of the structure.

11. An integrated circuit package in package system comprising:
    a substrate;
    a wire bonded die with an active side mounted over the substrate having the active side connected to the substrate with bond wires;
    support structures having substantially curved sides on the substrate;
    a structure, having overhangs at ends of the structure. mounted over the wire bonded die having a wire-in-film adhesive of a thermally conductive dielectric in contact with and between the structure and the wire bonded die with the support structures in contact with and between the wire-in-film adhesive and the substrate; and
    an encapsulation encapsulating the wire bonded die and the structure.

12. The system as claimed in claim 11 wherein:
    the structure is an inner stacking module.

13. The system as claimed in claim 11 wherein:
    the structure is an upper wire bonded die.

14. The system as claimed in claim 11 wherein:
    the structure is an interposer.

15. The system as claimed in claim 11 wherein:
    the structure is a pre-molded package.

16. The system as claimed in claim 11 further comprising:
    a component mounted over the substrate and under the wire bonded die; and
    wherein:
    the structure has corners.

17. The system as claimed in claim 16 wherein:
    the component is a bottom pre-molded package.

18. The system as claimed in claim 16 wherein:
    the component is a bottom wire bonded die.

19. The system as claimed in claim 16 wherein:
    the component is a flip chip.

20. The system as claimed in claim 16 wherein:
    the support structures are mounted at the corners of the structure.

* * * * *

UNITED STATES PATENT AND TRADEMARK OFFICE
CERTIFICATE OF CORRECTION

PATENT NO.       : 8,035,211 B2
APPLICATION NO.  : 12/055634
DATED            : October 11, 2011
INVENTOR(S)      : Ko et al.

It is certified that error appears in the above-identified patent and that said Letters Patent is hereby corrected as shown below:

Column 2:
line 49, add -- between numbers 2-2 as follows: delete "line 2-2 of FIG. 1;" and insert therefor
--line 2--2 of FIG. 1;--

Column 3:
line 46, add -- between numbers 2-2 as follows: delete "line 2-2 of FIG. 1." and insert therefor
--line 2--2 of FIG. 1.--

Column 8:
claim 11, lines 24-25, delete "structure. mounted" and insert therefor --structure, mounted--

Signed and Sealed this
Twentieth Day of March, 2012

David J. Kappos
*Director of the United States Patent and Trademark Office*